(12) United States Patent
Watanabe et al.

(10) Patent No.: US 10,002,845 B2
(45) Date of Patent: Jun. 19, 2018

(54) LEAD-FREE SOLDERING METHOD AND SOLDERED ARTICLE

(71) Applicant: FUJI ELECTRIC CO., LTD., Kawasaki (JP)

(72) Inventors: Hirohiko Watanabe, Hachioji (JP); Shunsuke Saito, Hachioji (JP); Masahiro Ono, Kawasaki (JP); Takashi Watanabe, Shiojiri (JP); Shinji Sano, Matsumoto (JP); Kazunaga Onishi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days. days.

(21) Appl. No.: 15/276,156

(22) Filed: Sep. 26, 2016

(65) Prior Publication Data

US 2017/0012018 A1    Jan. 12, 2017

Related U.S. Application Data

(63) Continuation of application No. PCT/JP2015/004289, filed on Aug. 26, 2015.

(30) Foreign Application Priority Data

Oct. 17, 2014    (JP) .................. 2014-212584

(51) Int. Cl.
*H01L 21/00* (2006.01)
*H01L 23/00* (2006.01)
(Continued)

(52) U.S. Cl.
CPC ............. *H01L 24/48* (2013.01); *B23K 1/008* (2013.01); *B23K 1/0016* (2013.01); *B23K 1/19* (2013.01);
(Continued)

(58) Field of Classification Search
CPC ... H01L 31/022425; H01L 2924/00013; H01L 2224/13099; Y02E 10/50;
(Continued)

(56) References Cited

U.S. PATENT DOCUMENTS 6,139,979 A    10/2000  Takaoka et al.
6,710,239 B2    3/2004  Tanaka
(Continued)

FOREIGN PATENT DOCUMENTS

CN    103551756 A    2/2014
JP    11-277290    10/1999
(Continued)

OTHER PUBLICATIONS

Morozumi, et al., "Reliability Design Technology for Power Semiconductor Modules", Fuji Electric Review, vol. 74, No. 2, (2001), p. 145-148.

(Continued)

*Primary Examiner* — Charles Garber
*Assistant Examiner* — Abdulfattah Mustapha

(57) ABSTRACT

In a soldering method for Ag-containing lead-free solders to be soldered to an Ag-containing member, void generation is prevented and solder wettability is improved. The soldering method for Ag-containing lead-free solders of the present invention is a soldering method for Ag-containing lead-free solders includes a first step of bringing a lead-free solder having a composition that contains Ag that a relation between a concentration C (mass %) of Ag contained in an Sn—Ag-based lead-free solder before soldering of a mass M(g) and an elution amount B(g) of Ag contained in the Ag-containing member becomes 1.0 mass %≤(M×C+B)× 100/(M+B)≤4.6 mass % and that the balance consists of Sn and unavoidable impurities into contact with the Ag-containing member, a second step of heating and melting the (Continued)

lead-free solder, and a third step of cooling the lead-free solder.

10 Claims, 8 Drawing Sheets

(51) Int. Cl.
| | |
|---|---|
| B23K 1/19 | (2006.01) |
| B23K 35/26 | (2006.01) |
| C22C 13/02 | (2006.01) |
| H01L 23/40 | (2006.01) |
| H01L 21/52 | (2006.01) |
| H01L 25/07 | (2006.01) |
| H01L 25/18 | (2006.01) |
| B23K 1/00 | (2006.01) |
| B23K 1/008 | (2006.01) |
| B23K 1/20 | (2006.01) |
| H05K 3/34 | (2006.01) |
| H01L 23/482 | (2006.01) |
| B23K 101/42 | (2006.01) |

(52) U.S. Cl.
CPC .............. *B23K 1/203* (2013.01); *B23K 35/26* (2013.01); *B23K 35/262* (2013.01); *C22C 13/02* (2013.01); *H01L 21/52* (2013.01); *H01L 23/40* (2013.01); *H01L 23/4827* (2013.01); *H01L 24/05* (2013.01); *H01L 24/29* (2013.01); *H01L 24/32* (2013.01); *H01L 24/81* (2013.01); *H01L 25/07* (2013.01); *H01L 25/18* (2013.01); *H05K 3/3463* (2013.01); *B23K 2201/42* (2013.01); *H01L 24/03* (2013.01); *H01L 24/06* (2013.01); *H01L 24/33* (2013.01); *H01L 24/49* (2013.01); *H01L 2224/0345* (2013.01); *H01L 2224/04026* (2013.01); *H01L 2224/05639* (2013.01); *H01L 2224/06181* (2013.01); *H01L 2224/291* (2013.01); *H01L 2224/29111* (2013.01); *H01L 2224/32227* (2013.01); *H01L 2224/32507* (2013.01); *H01L 2224/33181* (2013.01); *H01L 2224/4852* (2013.01); *H01L 2224/48091* (2013.01); *H01L 2224/48145* (2013.01); *H01L 2224/48245* (2013.01); *H01L 2224/48506* (2013.01); *H01L 2224/49109* (2013.01); *H01L 2224/73215* (2013.01); *H01L 2224/73265* (2013.01); *H01L 2224/85359* (2013.01); *H01L 2224/85805* (2013.01); *H01L 2224/85825* (2013.01); *H01L 2924/00014* (2013.01); *H01L 2924/0133* (2013.01); *H01L 2924/0134* (2013.01); *H01L 2924/01322* (2013.01); *H05K 2201/10166* (2013.01)

(58) Field of Classification Search
CPC ..... Y10T 428/12771; Y10T 428/12493; Y10T 428/12708; Y10T 428/12896; Y10T 428/12715; Y10T 428/12722; B23K 35/262; H05K 3/3463; H05K 3/244
See application file for complete search history.

(56) References Cited

U.S. PATENT DOCUMENTS

| | | | |
|---|---|---|---|
| 7,579,677 | B2 | 8/2009 | Ikeda et al. |
| 2002/0148499 | A1* | 10/2002 | Tanaka ............ H01L 31/022425 136/256 |
| 2003/0132271 | A1* | 7/2003 | Kao .................... B23K 35/262 228/180.22 |
| 2007/0089811 | A1 | 4/2007 | Ikeda et al. |
| 2008/0122050 | A1 | 5/2008 | Ikeda et al. |

FOREIGN PATENT DOCUMENTS

| | | |
|---|---|---|
| JP | 2001-35978 | 2/2001 |
| JP | 2001-358458 | 12/2001 |
| JP | 2002-217434 | 8/2002 |
| JP | 2003-1483 | 1/2003 |
| JP | 2004-261873 | 9/2004 |
| JP | 2005-45044 | 2/2005 |
| JP | 2005-116702 | 4/2005 |
| JP | 2005-340275 | 12/2005 |
| JP | 2006-32888 | 2/2006 |
| JP | 2007-123395 | 5/2007 |

OTHER PUBLICATIONS

Momose, et al., "New Assembly Technologies for Tjmax=175° C. Continuous Operation Guaranty of IGBT Module", Fuji Electric Review, vol. 86, No. 4, (2013), p. 249-252.
Gohara, et al., "Packaging Technology of IPMs for Hybrid Vehicles", Fuji Electric Review, vol. 86, No. 4, (2013), p. 258-262.
International Search Report dated Nov. 17, 2015 in corresponding International Application No. PCT/JP2015/004289.
International Preliminary Report on Patentability dated Apr. 27, 2017 in corresponding International Patent Application No. PCT/JP2015/004289.
Chinese First Notice of Reasons for Rejection dated Jan. 19, 2018 in corresponding Chinese Patent Application No. 2015800178045. 6 pp.

* cited by examiner

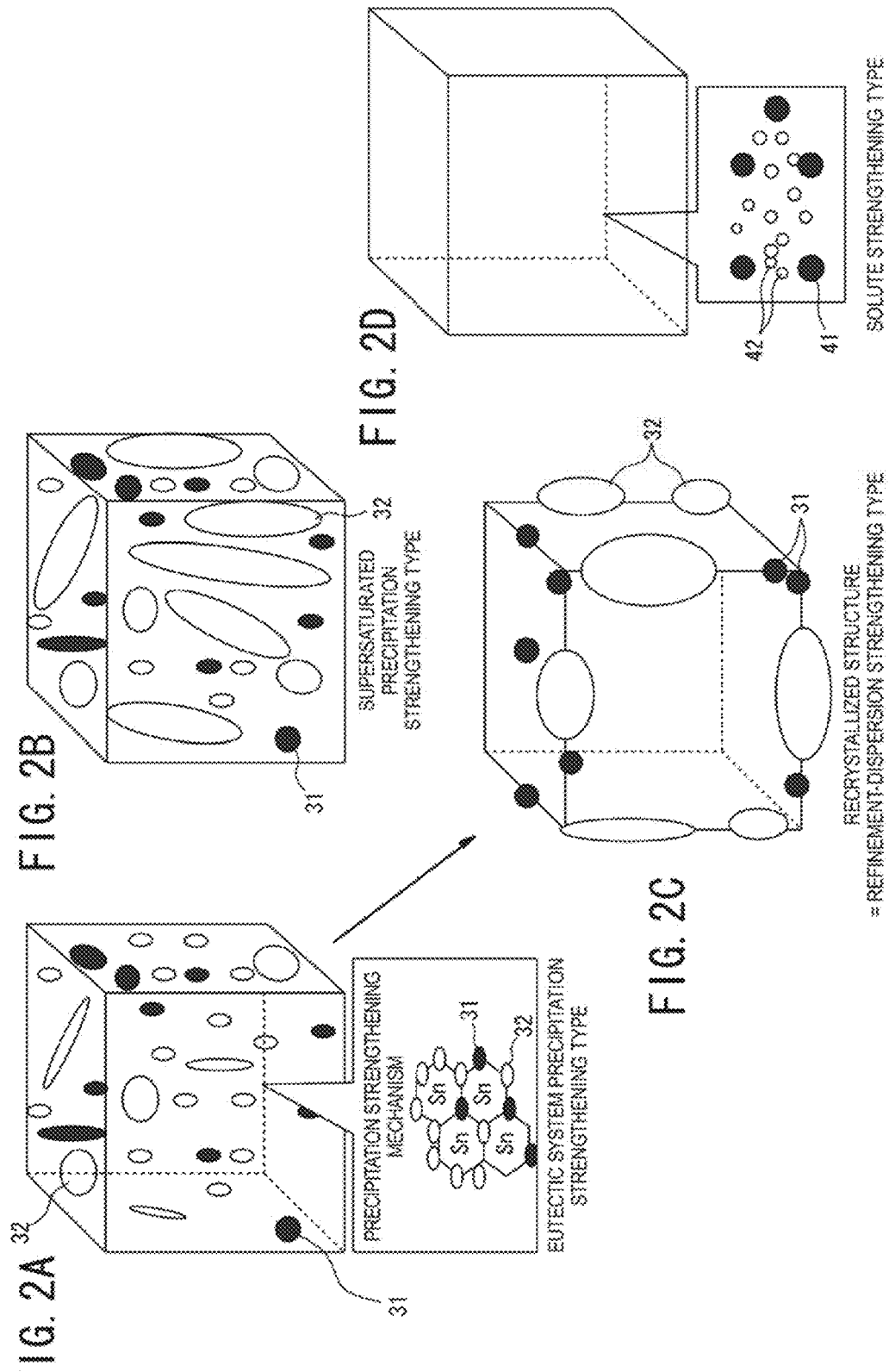

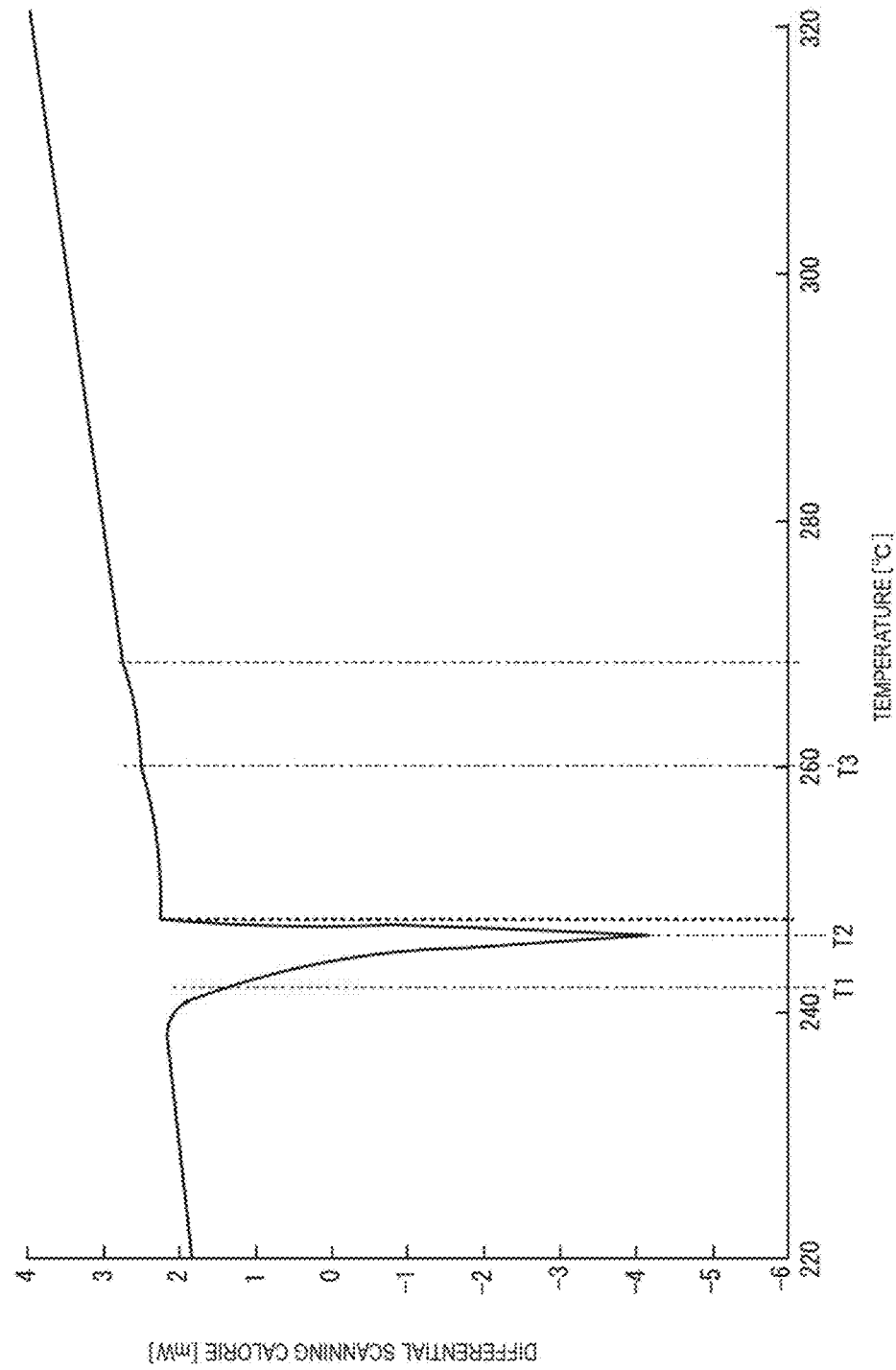

LEAD-FREE SOLDERING METHOD AND SOLDERED ARTICLE

CROSS-REFERENCE TO RELATED APPLICATIONS

This application is a continuation application, under 35 U.S.C. § 111(a), of international application No. PCT/JP2015/004289, filed Aug. 26, 2015, which is based on and claims foreign priority benefit to Japanese patent application No. 2014-212584, filed Oct. 17, 2014, the entire disclosure of which is herein incorporated by reference as a part of this application.

TECHNICAL FIELD

The present invention relates to a lead-free soldering method for soldering a joining member to a silver joint and a soldered article.

BACKGROUND ART

In a power semiconductor module that is used in a power conversion device and so forth and builds therein power semiconductor elements such as an IGBT, a power field effect transistor and so forth, die bond joining that performs internal connection of electronic components is performed between the power semiconductor chip and a substrate, and the solder is used in this die bond joining.

Recently, a lead-free solder containing no lead component has been used as a substitute for an Sn—Pb based solder because of environmental problems. As the solder to be applied to the power semiconductor module, an Sn—Ag based lead-free solder that is good in solder wettability, mechanical characteristics, resistance of heat transfer and has given satisfactory results in application to products is mostly used, in the currently known lead-free solders of various kinds of compositions (for example, see Patent Literatures 1 to 6)

Here, Patent Literature 1 discloses to connect a first electrode formed on an electronic component with an Ag-containing electrode formed on a circuit substrate, by using Bi-containing multicomponent system lead-free solders such as an Sn—Ag—Bi based one, an Sn—Ag—Cu—Bi based one and so forth.

In addition, Patent Literatures 2 and 3 disclose to join a substrate electrode with an electronic component electrode, by using Cu-containing multicomponent system lead-free solders such as an Sn—Ag—Cu based one, an Sn—Cu, an Sn—Cu—Ni one and so forth.

In addition, Patent Literatures 3 and 4 disclose to join a substrate with an electronic component, by using Ni-containing multicomponent system lead-free solders such as Sn—Ni—Ag and Sn—Ni—Ag—Cu based ones and so forth.

In addition, Patent Literature 5 discloses to join the substrate with the electronic component, by using an Sn—Ag—Ni—Cu-containing multicomponent system lead-free solder.

In addition, Patent Literature 6 discloses Sn—Sb—Co based or Sn—Sb—Fe based, Sn—Ag—Co based, Sn—Ag—Fe based lead-free solders.

In addition, as cited in later-mentioned description relevant to a relation between a solder composition of the present invention and surface tension, in Non-Patent Literature 1, that a solder material becomes small in surface tension at a temperature that is higher than a melting temperature by at least 25° C. and the surface tension does not change so much even at a temperature higher than that is described.

CITATION LIST

Patent Literatures

PTL 1: JP 2001-358458 A
PTL 2: JP 2005-340275 A
PTL 3: JP 2005-45044 A
PLT 4: JP H11-277290 A
PLT 5: JP 2004-261873 A
PLT 6: JP 2003-001483

Non Patent Literature

NPL 1: Kimio Degawa, Hirohiko Watanabe, Keiichi Mastumura, Influence of Substrate Plating on Lead-Free Solder Joint Part, Proc. Of Mate 97 (Microjoining and Assembly Technology in Electronics) pp. 49-54 (1997)

SUMMARY OF INVENTION

Technical Problem

Incidentally, in the above-mentioned Patent Literature 1, that when Ag in the Ag-containing electrode diffuses into Sn of a solder connection part and the Ag concentration is increased, a phenomenon that a capillary crystal of $Ag_3Sn$ abnormally grows and shorts with an adjacent solder joint part occurs is described. Accordingly, the above-mentioned Patent Literature 1 presents to prevent Ag in the Ag-containing electrode from diffusing into Sn by using a Bi-added lead-free solder as a subject.

Likewise, the above-mentioned Patent Literatures 2 and 3 present to prevent diffusion of an electrode material into a Sn-based solder by adding Cu to the lead-free solder as a subject.

In addition, the above-mentioned Patent Literatures 4 and 5 present to obtain the lead-free solder that is excellent in solder tensile strength, shock resistance by adding Ni to the lead-free solder as a subject.

In addition, the above-mentioned Patent Literature 6 presents to prevent electrode erosion by adding at least one kind in Co and Fe to the lead-free solder as a subject.

However, in the above-mentioned Patent Literatures 1 to 6, although an additive is added to the Sn—Ag based solder to form it as a multicomponent system one in order to prevent diffusion of the electrode material into the Sn-based solder or to improve the mechanical characteristics of the solder, nothing is disclosed about a lead-free solder that presents prevention of generation of voids in the lead-free solder and improvement of the solder wettability as a subject.

Accordingly, the present invention has been made focusing on the above-mentioned subjects and aims to provide a lead-free soldering method and a soldered article capable of promoting prevention of void generation and improvement of the solder wettability when soldering an Ag-containing member to a joining object member.

Solution to Problem

The inventors and others of the present invention have conceived to keep the Ag concentration in the lead-free solder low so as to reach an optimum Ag concentration after the lead-free solder has been melted and solidified, by taking an amount of Ag in the electrode to be diffused into the lead-free solder into consideration in advance.

Accordingly, in order to attain the above-mentioned object, one aspect of the soldering method for Ag-containing lead-free solders relevant to the first invention includes, in the soldering method for the Ag-containing lead-free solders to be soldered to the Ag-containing member, a first step of bringing a lead-free solder into contact with the Ag-containing member, the lead-free solder having a composition consisting Ag and a balance of Sn and unavoidable impurities, which satisfies a relation between a concentration C (mass %) of Ag contained in an Sn—Ag based lead-free solder before soldering of a mass M(g) and an elution amount B(g) of Ag contained in the Ag-containing member being as follows:

$$1.0 \text{ mass } \% \leq (M \times C + B) \times 100/(M+B) \leq 4.6 \text{ mass } \%,$$

a second step of heating and melting the lead-free solder, and a third step of cooling the lead-free solder.

Advantageous Effects of Invention

According to the present invention, in the soldering method for the Ag-containing lead-free solder to be soldered to the Ag-containing member, the void generation can be prevented and the solder wettability can be improved.

In addition, a soldered article of high durability can be provided by joining the Ag-containing electrode to a wiring circuit pattern of a substrate, by using this soldering method for the Ag-containing lead-free solder.

BRIEF DESCRIPTION OF DRAWINGS

FIGS. 2A-2D are diagrams illustrating solidification types of solders, in which FIG. 2A illustrate a eutectic system precipitation strengthening type, FIG. 2B illustrates a supersaturated precipitation strengthening type, FIG. 2C illustrates a recrystallized structure, FIG. 2D illustrates a solid solution strengthening type.

FIG. 3A is a photomicrograph of an Sn-1.0 mass % Ag solder, FIG. 3B is that of a Sn-3.5 mass % Ag solder, FIG. 3C is that of an Sn-3.5 mass % Ag-0.5 mass % Cu-0.07 mass % Ni solder, FIG. 3D is that of an Sn-4.0 mass % Ag solder, FIG. 3E is that of an Sn-5.0 mass % Ag solder.

FIG. 10 is a graph illustrating a result of differential scanning calorimetric analysis of a binary peritectic system one of Sn-10Sb.

DESCRIPTION OF EMBODIMENTS

In the following, embodiments of the present invention will be described in association with the drawings.

First Embodiment

Figure 1:
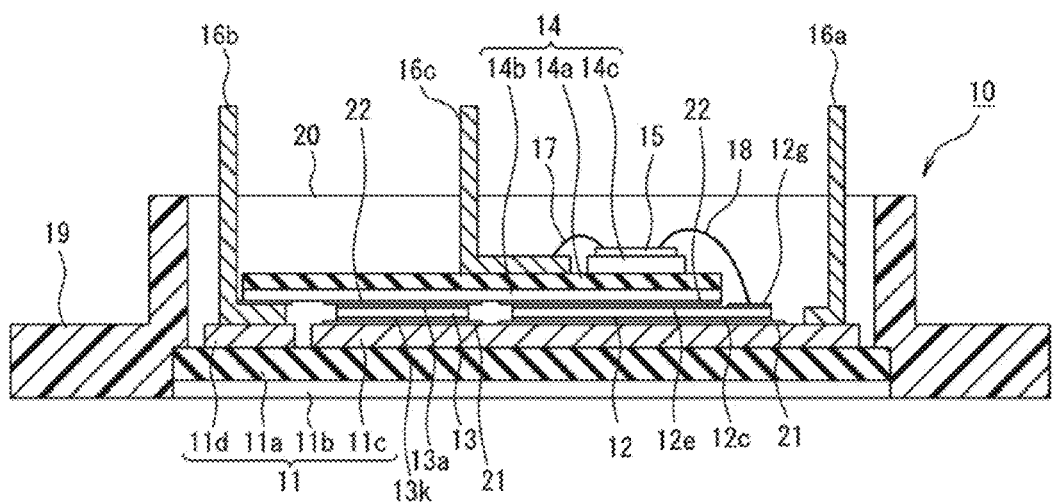
FIG. 1 is a sectional diagram illustrating one example of a power semiconductor module to which the present invention can be applied.

First, one example of a power semiconductor module to which a lead-free solder according to the invention of the present application can be applied will be described in FIG. 1.

A power semiconductor module 10 is equipped with an insulating substrate 11, an IGBT (Insulated Gate Bipolar Transistor) 12 as a power semiconductor element loaded on this insulating substrate 11 and an FWD (Free Wheeling Diode) 13 as a power semiconductor element.

The insulating substrate 11 has an insulating layer 11a, a metal plate 11b is formed on the rear surface side of this insulating layer 11a, circuit patterns 11c and 11d are formed on the front surface side of the insulating layer 11a. Then, electrodes formed on rear surfaces of the IGBT 12 and the FWD 13 are connected onto the circuit pattern 11c via a lead-free solder 21.

In addition, the power semiconductor module 10 has an insulating substrate 14 arranged on front surfaces of the IGBT 12 and the FWD 13. This insulating substrate 14 has an insulating layer 14a, a circuit pattern 14b is formed on the rear surface side of this insulating layer 14a, and a circuit pattern 14c is formed on the front surface side of the insulating layer 14a. Then, the circuit pattern 14b is connected to electrodes formed on the front surfaces of the IGBT 12 and the FWD 13 via a lead-free solder 22. The IGBT 12 and the FWD 13 are loaded on the insulating substrate so as to configure an anti-parallel circuit in this way. In addition, a control IC 15 that controls the IGBT 12 is loaded on the circuit pattern 14c.

In addition, external lead terminals 16a and 16b are respectively connected onto the circuit patterns 11c and 11d of the insulating substrate 11, and an external lead terminal 16c is arranged on a front surface of the insulating layer 14a of the insulating substrate 14.

Further, the control IC 15 and the external lead terminal 16c are connected together via a bonding wire 17, and the control IC 15 and a gate electrode 12g of the IGBT 12 are connected together via a bonding wire 18.

Then, the insulating substrate 11, the IGBT 12, the FWD 13, the insulating substrate 14, the control IC 15 and the external lead terminals 16a to 16c are housed in a resin case 19 and a sealing resin 20 is charged into this resin case 19 and, thereby the power semiconductor module 10 is configured.

The control IC 15 is connected to the circuit pattern 14c of the insulating substrate 14 with a not illustrated lead-free solder.

Here, a collector electrode 12c that is configured by an Ag electrode material and serves as a high potential side electrode of a transistor is formed on the rear surface of the IGBT 12 almost over the entire surface, and this collector electrode 12c is electrically connected to the external lead terminal (a collector terminal) 16a of the power semiconductor module 10 via the lead-free solder 21 and further via the circuit pattern 11c. An emitter electrode 12e that serves as a low potential side electrode of the transistor and the gate electrode 12g that serves as a control electrode thereof are formed on the front surface of the IGBT 12. The emitter electrode 12e is electrically connected to the external lead terminal 16b via the lead-free solder 22, via the circuit pattern 14b of the insulating substrate 14, and further via the lead-free solder 22, and the gate electrode 12g is electrically connected to the control IC 15 via the bonding wire 18.

In addition, a cathode electrode 13k is formed on the rear surface of the FWD 13, this cathode electrode 13k is electrically connected to the external lead terminal 16a via the lead-free solder 21, via the circuit pattern 11c of the insulating substrate 11, an anode electrode 13a is formed on the front surface of the FWD 13, and this anode electrode 13a is electrically connected to the external lead terminal 16b via the lead-free solder 22, via the circuit pattern 14b of the insulating substrate 14, and further via the lead-free solder 22.

Incidentally, the collector electrode 12c, the cathode electrode 13k, and the emitter electrode 12e, the anode electrode 13a that have been formed on the rear surfaces and the front surfaces of the IGBT 12 and the FWD 13 and consist of Ag electrodes configured by Ag-containing electrode materials are formed by making the Ag-containing electrode materials into thin films of a range of at least 0.2 µm and not more than 2 µm in electrode thickness by, for example, a sputtering method.

Here, the reason why the electrode thickness range of the Ag electrode is set as mentioned above is as follows.

That is, when the electrode thickness is set to less than 0.2 µm, since in joining the collector electrode 12c, the emitter electrode 12e of the IGBT 12 and the cathode electrode 13k, the anode electrode 13a of the FWD 13 to the circuit pattern 11c of the insulating substrate 11 and the circuit pattern 14b of the insulating substrate 14 by using binary eutectic system lead-free solders 21 and 22 of Sn—Ag as described later, when Ag in the respective electrodes 12c, 12e, 13k and 13a has diffused into the lead-free solders 21 and 22, the basis is exposed and an electrical joining failure occurs, it is not favorable. On the other hand, it is difficult for a current status deposition technique such as the sputtering method and so forth to form the Ag electrode of a thickness exceeding 2 µm. Therefore, the electrode thickness of the Ag electrode is set to at least 0.2 µm and not more than 2 µm.

In addition, as the lead-free solders 21 and 22 used for joining, two kinds of the lead-free solder that primarily consists of the binary eutectic system of Sn—Ag and the lead-free solder that primarily consists of a multiple eutectic system that a precipitation strengthening element has been added to the binary eutectic system of Sn—Ag are used.

Then, in a case where the Ag electrode has been sued as the electrode, a phenomenon that the wettability is reduced in comparison with a general Au electrode occurs. In addition, by using the Ag electrode, since Ag in the Ag electrode diffuses into the solder, the Ag amount in the Sn—Ag system increases and it turns to a hyper-eutectic composition, a phenomenon that the wettability is lowered and a cycle life is lowered in a cooling/heating cycle test occurs. Thus, by aiming at a solder composition condition that the amounts of Ag in the Ag electrode and the solder to be supplied are adjusted and Sn and Ag are made eutectic after the solder has been melted and solidified with the Ag electrode, a favorable junction that can improve the wettability and can increase the cycle life is obtained.

In this junction, an electrode area is large, it is a method of joining a tabular joining body with a tabular joined body, and it takes a precipitation type solidification form. Since when an electrode material that exhibits the precipitation type is used in the solder components, it turns to a supersaturated composition (a component ratio), a junction failure occurs. In the present invention, it is made as a method that in a case where the joining body uses a metal that exhibits the precipitation type in die bond joining, a favorable joining body is obtained by limiting the solder component to be supplied and adjusting it so as to indicate an optimum value of the wettability when solidified.

In an Sn-3.5 mass % Ag eutectic solder, an Sn-3.5 mass % Ag-0.75 mass % Cu eutectic solder and so forth that primarily consist of Sn—Ag, although a eutectic system precipitation strengthening type solidification form illustrated in FIG. 2A is exhibited, a super saturated precipitation strengthening type solidification structure illustrated in FIG. 2B is exhibited by using the Ag electrode. That is, in a solidification state of the eutectic system precipitation strengthening type, when, for example, the Sn-3.5 mass % Ag-0.75 mass % Cu eutectic solder is taken as an example, it turns to a structure that an intermetallic compound 31 of Ag and Sn that is $Ag_3Sn$ and an intermetallic compound 32 of Cu and Sn that is $Cu_6Sn_5$ surround a fine eutectic structure of β-Sn and disperse therein/precipitation-strengthen it as illustrated in FIG. 2A.

Likewise, in the Sn-3.5 mass % Ag eutectic solder, although not illustrated, it turns to a structure that the intermetallic compound 31 of Ag and Sn that is $Ag_3Sn$ surrounds the fine eutectic structure of β-Sn and disperses therein/precipitation-strengthens it. On the other hand, in a case where it is in the super saturated precipitation strengthening type solidification state, the intermetallic compound 31 ($Ag_3Sn$), the intermetallic compound 32 ($Cu_6Sn_5$) and so forth excessively crystallize out and grow as illustrated in FIG. 2B.

Then, as illustrated in FIG. 2C, when the eutectic system precipitation strengthening type solidification structure illustrated in FIG. 2A is cooled and recrystallized after it has reached a recrystallization temperature, then when the fine intermetallic compound 32 ($Cu_6Sn_5$) is generated dispersedly and it turns to a refinement/dispersion strengthening type, a solute strengthening function is eliminated and the solidification structure after recrystallized becomes high in ductility. Incidentally, in a case where a pinning effect that the intermetallic compound suppresses crystal grain growth and plastic deformation occurs in recrystallization, there are cases where it becomes low in ductility in reverse.

On the other hand, in the super-saturated precipitation strengthening type illustrated in FIG. 2B, even when it has been cooled and recrystallized after it has reached the recrystallization temperature, it is difficult for the recrystallized structure to turn to the refinement/dispersion strengthening type.

In addition, since Ag can be solid-dissolved by about 0.09 atom % into Sn and a very small amount is set as a solid-solubility limit, it is generally known that it crystallizes out in Sn as a precipitate of $Ag_3Sn$ when solidified.

On the other hand, Au that has been mainly used so far for the electrode on an element rear surface in Japan is as large as 6.8 atom % in solid solubility limit into Sn, in a case where an electrode thickness of Au has been set to, for example, 0.2 µm, it has never occurred that precipitates such as AuSn or $Au_{10}Sn$, $Au_5Sn$, $AuSn_2$, $AuSn_4$ and so forth crystallize out in the Sn—Ag based solder joint part.

The solidification structure of the Sn—Ag based solder observed through a cold cathode type scanning electron microscope has been illustrated in FIGS. 3A-3E. A target solidification structure that a solder material has been melted into a ceramics crucible at a temperature (332° C.) that 100° C. has been added to 232° C. that is a melting point of Sn and has been solidified in a stainless steel die that has been managed at a normal temperature was prepared as a test sample. A relation between an Ag concentration and the solidification structure of the SnAg based solder was examined by using these samples.

Figure 3A:
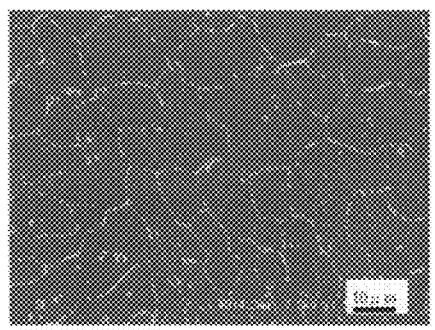
FIGS. 3A-3E are diagrams illustrating a solidification structure of an Sn—Ag based solder observed through a cold cathode type scanning electron microscope.

In the Sn-1.0 mass % Ag one, it is seen that white $Ag_3Sn$ forms a mesh network structure although only slightly around β-Sn of a gray part and exhibits precipitation strengthening as illustrated in FIG. 3A. From this, it can be confirmed that a strengthening mechanism of the solidification structure by the pinning effect that the Sn—Ag based solder pins β-Sn with $Ag_3Sn$ works.

Figure 3B:
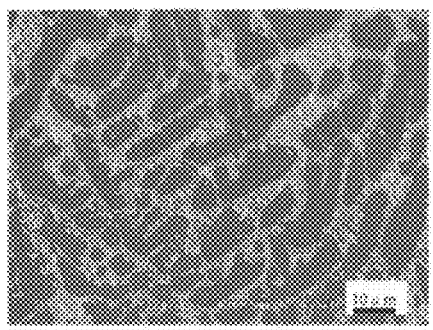
Figure 3C:
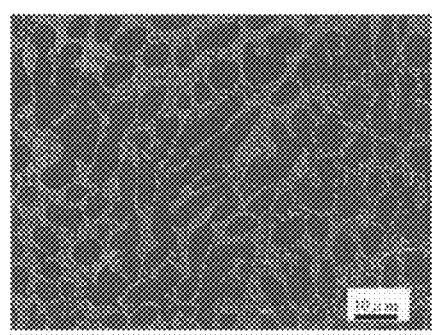

In the An-3.5 mass % Ag one, the mesh structure of $Ag_3Sn$ becomes denser relative to that of the Sn-1.0 mass % Ag one as illustrated in FIG. 3B, also in a composition that a compound other than $Ag_3Sn$ such as, for example, Sn—Ag—Cu—Ni and so forth crystallizes out, it can be confirmed that $Ag_3Sn$, $(CuNi)_5Sn_5$ similarly suppress growth of a β-Sn primary crystal and forms a uniform mesh structure as illustrated in FIG. 3C.

Figure 3D:
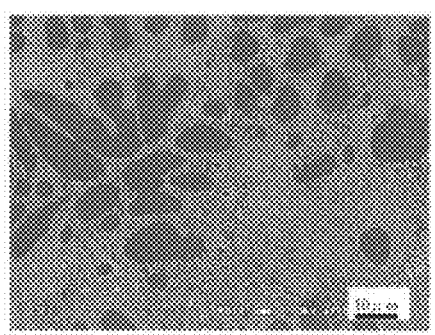

The similar mesh structure can be confirmed up to an Sn-4.0 mass % Ag one illustrated in FIG. 3D.

Figure 3E:
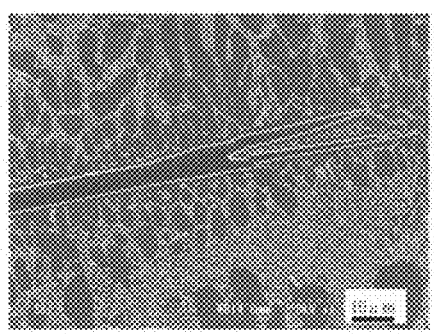

However, in an Sn-5.0 mass % Ag one, it is seen that course $Ag_3Sn$ is grown in the solidification structure (a black rod-like one in the photograph) as illustrated in FIG. 3E.

In a system that the course compound such as that in this Sn-5.0 mass % Ag one crystallizes out, as a solidified body, the pinning effect of the uniform $Ag_3Sn$ that suppresses growth and deformation of the β-Sn primary crystal is reduced. During melting (solder-joining), due to increases in viscosity and surface tension of a solder liquid caused by $Ag_3Sn$ having a liquidus line temperature of at least 480° C. and so forth, an effect of discharging gasses generated when joining is lowered and the void generation rate is increased.

Although the Ag amount of about 3.5 mass % used for configuring a eutectic crystal is prepared in advance for the solder to be supplied, that Ag in the Ag electrode is eluted out into the molten solder during solder joining, the Sn-3.5 mass % Ag one after melt-solidified is increased in Ag concentration and is remarkably lowered in solder joining property occurs as a phenomenon by using the Ag electrode.

Figure 4:
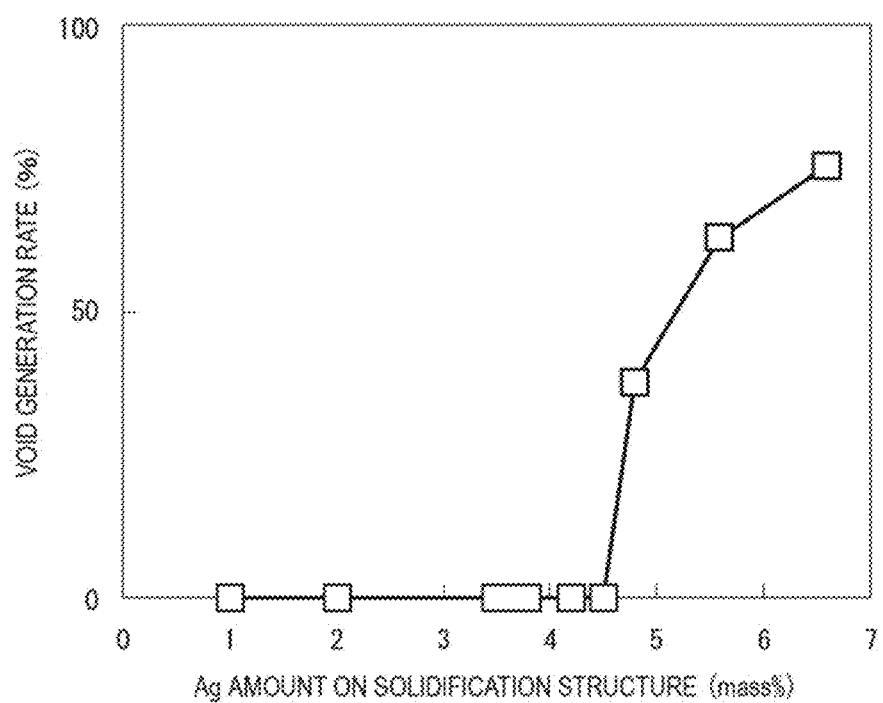
FIG. 4 is a graph illustrating a relation between an Ag concentration and a void generation rate of the lead-free solder after melt-solidified.

The Ag concentration of the solidification structure and a void observation result of the solder joint part after solder-joined that has been observed by an ultrasonic flaw detector (manufactured by SONOSCAN, 50 MHz) have been illustrated in FIG. 4. As a joining condition that an experiment was done, joining was performed under a condition of 310° C. in peak temperature, four minutes and hydrogen atmosphere.

Figure 5:
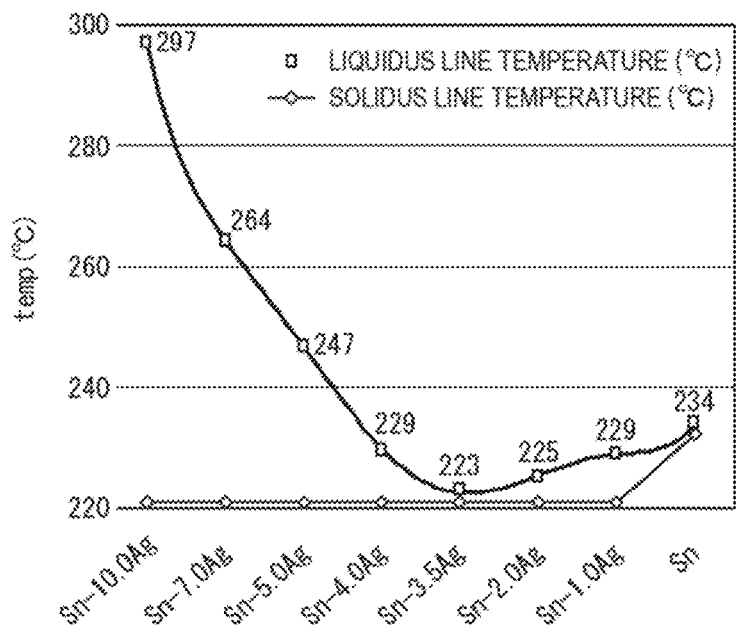
FIG. 5 is an enlarged diagram of the vicinity of an Sn-3.5 mass % Ag eutectic crystal in a binary phase diagram of Ag—Sn.

Consequently, it was confirmed that a void generation rate (%) is 0% and the void is not generated in a range that the Ag concentration is at least 1.0 mass % and not more than 4.6 mass %. Here, when the Ag concentration becomes less than 1.0 mass %, a shrinkage cavity that causes a solidification crack when solidified is generated and therefore it is not favorable. On the other hand, that the Ag concentration reaches a high Ag concentration exceeding 4.6 mass %, and thereby the precipitates are increased as indicated by the super-saturated precipitation strengthening type in FIG. 2B and the fluidity of the solder is worsened, and the liquidus line temperature is raised with increasing the Ag concentration as illustrated in FIG. 5 becomes one factor of wettability reduction. Here, FIG. 5 is an enlarged diagram of the vicinity of the Sn-3.5 mass % Ag eutectic crystal in an equilibrium state diagram of an Ag—Sn alloy, for example, illustrated in FIG. 6 of Japanese Patent Application laid-Open No. H5-41563.

Accordingly, in the present embodiment, such a composition that the Ag concentration is set to at least 1.0 mass % and not more than 4.6 mass % that the void generation rate is maintained around 0% and generation of the shrinkage cavity when solidified can be suppressed, and the balance consists of Sn and the unavoidable impurities is made.

As for the solder wettability, it is thought that the surface tension of the liquefied solder, a contact angle, the viscosity of the liquefied solder, and the oxygen concentration in the atmosphere influence it. Then, it is thought that the smaller the surface tension of the solder is, the smaller the contact angle becomes and the more the wettability with a base material is improved. It is difficult to measure the viscosity of the liquefied solder under a high temperature. To change the oxygen concentration in order to improve the wettability leads to an increase in installation cost. Regarding the oxygen concentration in the atmosphere, it can be supposed that the oxygen concentration is constant when soldering is performed in the atmospheric air. Accordingly, in the following, the influence of the solder composition on the surface tension was examined.

Figure 6:
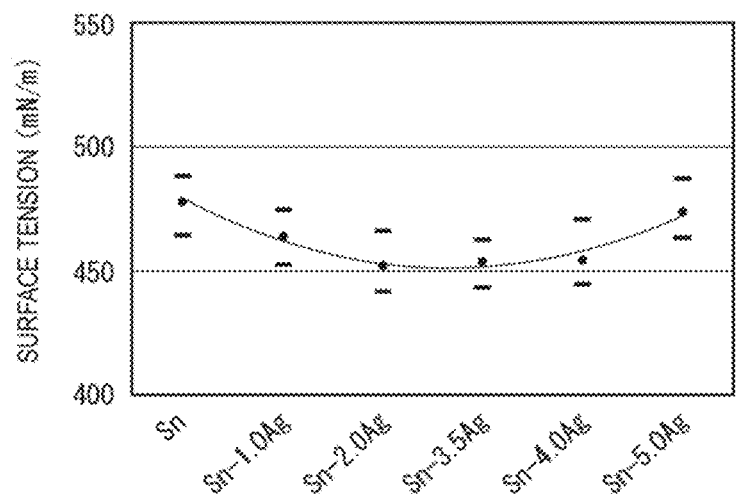
FIG. 6 is a graph illustrating a relation between the Ag concentration and a surface tension of an Sn—Ag based solder.

A relation between the Ag concentration and the surface tension of the Sn—Ag based solder was illustrated in FIG. 6. Measurement of the surface tension was performed by a Wilhelmy method. The Wilhelmy method is a method of vertically suspending a measuring plate, immersing a lower part of the plate in a sample solution and measuring force that the plate is drawn into the sample solution by the surface tension. A measurement condition was such that a temperature that 30° C. was added to the liquidus line temperature (the melting temperature) was set as a measurement temperature for each sample solution and it was measured by the measuring plate that an appropriate amount of a rosin-based flux was applied onto a phosphorus deoxidized copper plate of 30 mm in width×50 mm in height×0.3 mm in thickness. The measurement was performed in the atmospheric air. An immersing speed was 5 mm/sec., an immersing depth was 2 mm, an immersing time was 10 sec. As for the temperature of the sample solution, Non-Patent Literature 1 reports that the surface tension of the solder material is lowered from the melting temperature up to the temperature that 25° C. is added to the melting temperature and it does not change so much at a temperature higher than that that 25° C. has been added to the melting temperature. The measurement was performed this time at a temperature that 30° C. has been added to the melting temperature with reference to this.

The Sn—Ag based solder material becomes the smallest in surface tension in the vicinity of Sn-3.5 mass % Ag. When taking the wettability into consideration, it is favorable that the Ag concentration be set in a range of at least 1.8 mass % and not more than 3.8 mass %, and it is more favorable that it be at least 3.0 mass % and not more than 3.5 mass % with a point that the surface tension is minimized being interposed.

When summarizing the above, by making it as the lead-free solder having the composition that contains Ag that the relation between the concentration C (mass %) of Ag contained in the Sn—Ag based lead-free solder before soldered of the mass M(g) and the elution amount B(g) of Ag contained in the Ag-containing member becomes 1.0 mass % ≤ (M×C+B)×100/(M+B) ≤ 4.6 mass % and that the balance consists of Sn and the unavoidable impurities, there can be provided the lead-free solder that can avoid generation of the voids and has improved the solder wettability.

Figure 7:
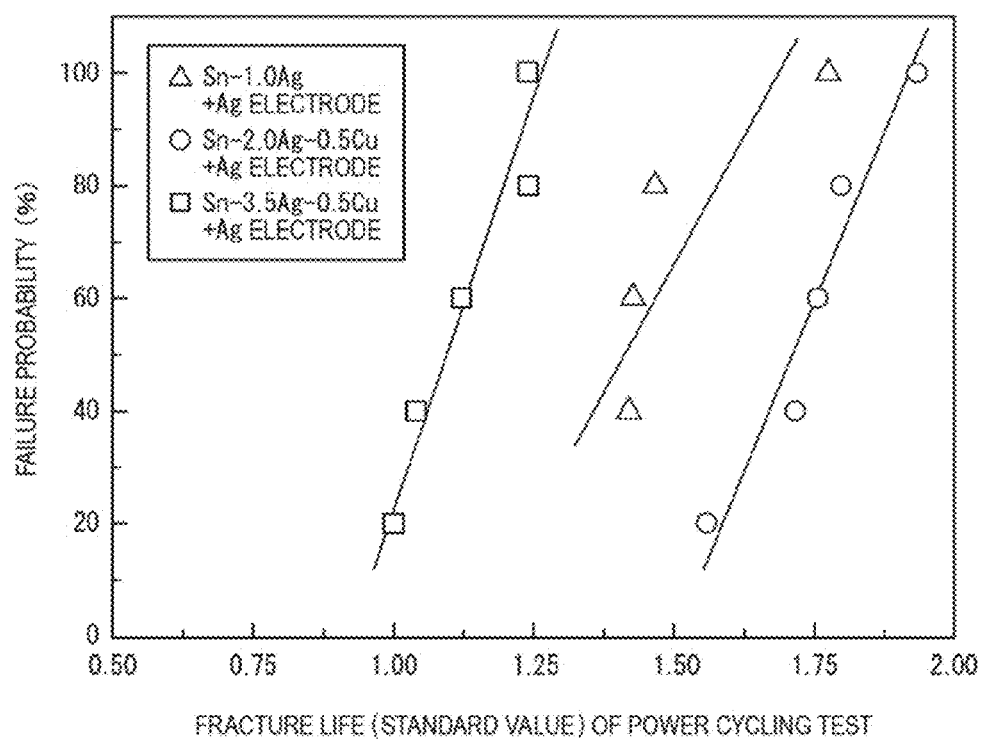
FIG. 7 is a graph illustrating a relation between a fracture life and a failure probability of a power cycle test.

In addition, a result of a power cycling test on the power semiconductor module with the IGBT element being solder-joined is illustrated in FIG. 7. The power cycling test was performed by a method of repeating a time period that a voltage is applied between the emitter electrode and the collector electrode of the IGBT element and switching is repeated between ON and OFF at the gate electrode so as to generate heat from the IGBT element, and a time period that the gate electrode is kept OFF and heat is radiated and repeating cycles of heating and heat radiation in a range of 40° C. to 140° C. That is, it was performed by setting a temperature difference ΔT to 100° C.

FIG. 7 is a diagram that a value that has been standardized with a cycle number that the binary eutectic solder of Sn-3.5 mass % Ag has been destroyed at the earliest stage being set as 1 has been taken on the horizontal axis and the failure probability has been plotted on the vertical axis. As sample materials, lives when the respective solders of Sn-1.0 mass % Ag (equivalent to the sum total 2.0 mass % of the compounds in the solder when the elution amount from the Ag electrode after the solder has solidified on the Ag electrode has been set to 1.0 mass %), Sn-2.0 mass % Ag-0.5 mass % Cu (equivalent to the sum total 3.5 mass % of the compounds in the solder when the elution amount from the Ag electrode after the solder has solidified on the Ag electrode has been set to 1.0 mass %), Sn-3.5 mass % Ag-0.5 mass % Cu (equivalent to the sum total 5.0 mass % of the compounds in the solder when the elution amount from the Ag electrode after the solder has solidified on the Ag electrode has been set to 1.0 mass %) have been used and the Ag amount (the sum total of the precipitates) in the solder after the solder has solidified on the Ag electrode has been changed are indicated. The thickness of the Ag electrode was set to 700 nm.

It is seen that in a case where the Ag electrode has been used, the life becomes the longest in a case where Cu that is the precipitate strengthening type material has been added to the solder material of the Ag concentration 2.0% at which the sum total of the compounds in the solder after the solder has solidified on the Ag electrode becomes equivalent to 3.5%.

Strain is generated in a power semiconductor element equipped with members of different kinds of materials due to a difference in thermal expansion coefficient among the members when heated. For example, the thermal expansion coefficient of Si is 2.6 ppm/K, the thermal expansion coefficient of the solder is 23.0 ppm/K, and the thermal expansion coefficient of Cu is 16.0 ppm/K. An interface between members that are the largest in difference in thermal expansion coefficient is the most influenced by the strain and that part is liable to be destroyed. Life evaluation by the power cycling test is a method of accelerating the destruction caused by the strain by heating and cooling cycles and thereby estimating the life of the power semiconductor element. Since the difference in thermal expansion coefficient between Si and the solder is the largest on the solder joint part of the power semiconductor element, the largest strain is generated in the vicinity of the interface between Si and the solder and that part is destroyed.

On the other hand, the same effect is obtained also by varying the solder composition corresponding to the thickness of the Ag electrode. For example, in a case where the Ag electrode is 0.1 µm, the solidification structure that is almost equivalent to that of 3.5 Ag is obtained with the solder of 2.9 mass % Ag, and in a case where the Ag electrode is 1000 nm, the solidification structure that is almost equivalent to that of 3.5 mass % Ag is obtained with the 1.5 mass % Ag solder.

In the binary solder of Sn—Ag, excluding the unavoidable impurities (Cu, Zn, Fe, Al, As, Cd, Ag, Au, In, P and so forth) for a precipitate strengthening type material, Fe, Cr, Co, Zn, Pt, Ti, Cu, Ni and so forth that exhibit the precipitation strengthening type for Sn that is a principal component can be thought as the total amount of the precipitants of the entire system for the amount of supersaturated additives that exceed the solid-solution type. Since each of the above-mentioned metals is a metal that indicates the solubility limit that is not more than 0.1 mass %, it is thought that almost all of the elements that have been added in advance become the precipitants (the compounds), and the sum total of the intentionally added elements such as Cu, Ni, Fe and so forth becomes equivalent to 3.5 Ag, similarly to that the sum total of the amounts of Ag in the Ag electrode and the solder becomes the amount of the precipitants when solidified, and thereby the above-mentioned power cycling life effect is obtained.

Accordingly, also in the multiple eutectic system solder that the precipitation strengthening type element has been added to the binary system solder of Sn—Ag such as, for example, Sn—Ag—Cu, Sn—Ag—Ni and so forth, the lead-free solder that has improved the wettability with no generation of the voids can be configured by making it have a composition that the sum total of Ag of the solidification structure is set to the range of at least 1.0 mass % and not more than 4.6 mass % and the balance consists of Sn and the unavoidable impurities.

Second Embodiment

Next, as the second embodiment, a case where Sb that exhibits a solid solution strengthening type solidification structure illustrated in FIG. 2D is added to the multiple eutectic system solder that the solid solution strengthening type element has been added to the above-mentioned binary eutectic system solder of Sn—Ag and the binary eutectic system solder of Sn—Ag so as to form a multiple eutectic system lead-free solder of Sn—Ag—Sb will be described. Here, the solid solution strengthening solidification structure is adapted to solute-strengthen it by intruding Sb that serves as solute atoms 42 into between Sn that serves as solvent atoms 41.

The mechanical strength when the solder is solidified can be improved by adding Sb to the binary eutectic system solder of Sn—Ag. In this case, even in a case where a very small amount of Sb is added to the binary eutectic system one of Sn—Ag, the mechanical strength (tensile strength) when solidified can be improved. In addition, a solid solution limit of Sb is 9.5 mass % and Sb can be added without crystallizing out a compound of SbSn up to this solid solution limit. In strict, although the solid solution limit of Sb in the solder joining body is made different depending on a cooling speed, a diffusion element of a joint base material, in general, a Sb addition concentration at which no precipitate is generated generally in ten minutes that is a time for solder joining, in the cooling speed range of 1° C. to 20° C./sec is defined as the solid solution limit.

Therefore, the addition concentration of Sb is set to not more than 9.5 mass % with no inclusion of 0.

Figure 9:
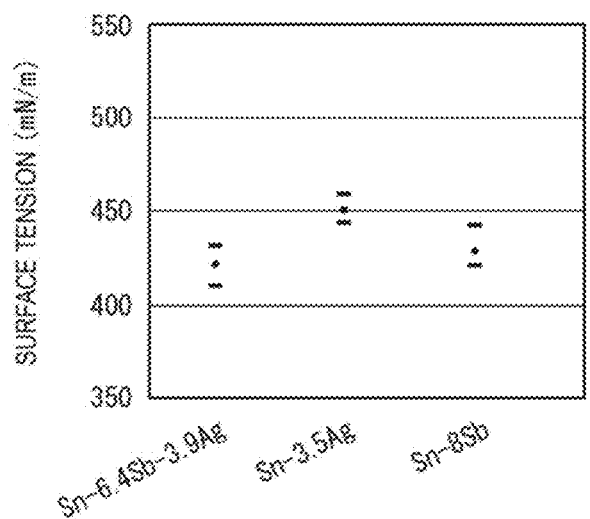
FIG. 9 is a graph illustrating a relation between the Ag concentration and the surface tension of the Sn—Ag—Sb based solder.

In addition, as illustrated in FIG. 9, by adding Sb to the binary eutectic system solder of Sn—Ag and the multiple eutectic system solder of Sn—Ag—Ni, the surface tensions of them can be suppressed small in comparison with 450 mN/m that is a minimum value of the surface tension of the binary eutectic system solder of Sn—Ag in the aforementioned first embodiment.

Figure 8:
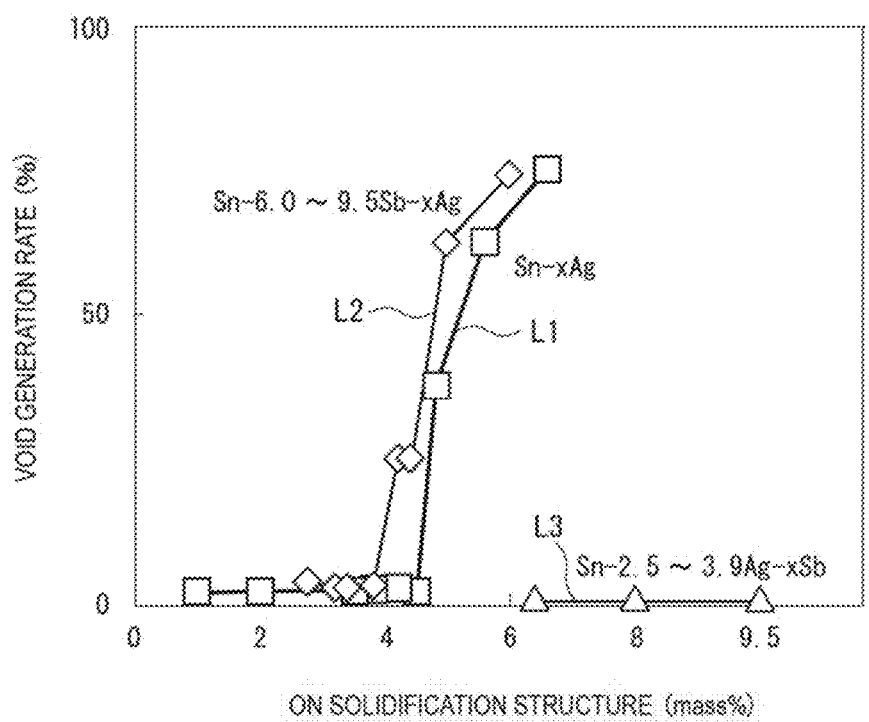
FIG. 8 is a graph illustrating a relation between the Ag concentration and the void generation rate of an Sn—Ag—Sb based one after melted and solidified.

Then, as indicated by a characteristic line L2 in FIG. 8, in a tertiary eutectic system solder of Sn-6.0 to 9.5 Sb-x Ag that Sb of 6.0 to 9.5 mass % has been added to the binary eutectic system solder of Sn—Ag indicated by a characteristic line L1, the void generation rate is maintained almost at "0%" in a range of at least 2.5 mass % and not more than 3.9 mass % in Ag addition concentration after melted and solidified, by changing the x mass % that is the Ag addition concentration.

In the tertiary eutectic system solder of Sn-6.0 to 9.5 Sb-x Ag indicated by this characteristic line L2, the void generation rate can be suppressed to almost "0%" when Ag concentration is in the vicinity of 2.5 to 3.9 mass %. Therefore, when a Sb containing range is defined in case of 2.5 to 3.9 mass % Ag concentration, taking that the void generation rate is maintained at 0% into consideration, the Sb addition concentration at which the void generation rate can be suppressed to about 0% becomes 6.2 mass % to 9.5 mass & as indicated by a characteristic line L3 in FIG. 8.

Although it is desirable to set the Sb addition concentration to not more than 9.5 mass % that is the solid solution limit in this way, in a case where Sb is added in a range exceeding 9.5 mass % that is the solid solution limit, Sb that has remained not-melted precipitates as an SnSb alloy and becomes a lead-free solder that has both of solute strengthening and precipitation strengthening. However, since the Sb addition concentration of about 9.5 mass % to 10 mass % is a peritectic point, in a case of setting to an addition concentration exceeding that value, such a problem occurs that the void generation rate is increased from 0%, and the mechanical strength becomes too high and the cycle life is shortened.

Here, an upper limit of the addition concentration of Sb should be set in a range not greatly deviating from the peritectic composition, and it is desirable to set the addition concentration of Sb to not more than 15 mass %, favorably, not more than 13 mass %, because in a high-speed cooling region that the cooling speed exceeds 20° C./sec, growth of the compound of SbSn that will become a solidified nucleus does not become course (not more than 100 μm). Further, when taking a reflow soldering process condition in a low-speed cooling region of not more than 20° C./sec that is the cooling speed in a general soldering reflow process into consideration, it is more favorable to set an additive concentration to not more than 9.5 mass % that is the solid solution limit that the course compound of Sb does not crystallize out. Since crystallization-out of the compound impedes flowing of the liquefied solder, a dissolved gas in a metal generated when dissolving with the solder joint material, an oxide and air that is physically present remain in the liquid and impede discharge thereof, it is favorable to suppress crystallization-out of the compound as much as possible and to make the size of the compound minute (not more than 10 μm).

Then, in a case where the addition concentration of Sb is set to not more than 9.5 mass % that just reaches the solid solution limit, it is favorable to set the Ag addition concentration to at least 3.3 mass % and not more than 3.9 mass % from the characteristic line L2 in FIG. 8 in order to maintain the void generation rate at 0%.

On the other hand, in case of setting it to Sn-2.5 to 3.9 Ag-x Sb, the void generation rate (%) can be almost reduced to 0% by setting the addition concentration x of Sb to at least 6.2 mass % and not more than 15 mass %. However, when taking suppression of crystallization-out of the course compound of SbSn into consideration, it is favorable to set the addition concentration of Sb in a range of a sub-peritectic crystal that is at least 6.2 mass % and not more than 9.5 mass %.

Moreover, when the differential scanning calorimetric analysis (DSC analysis) was performed on a binary peritectic system of Sn-10 Sb, it was confirmed that a solidus line temperature T1 is 242.0° C., a temperature T2 that indicates a peak of an endothermic reaction is 246° C., a liquidus line temperature T3 is 260.1° C. as illustrated in FIG. 10.

Since in such a binary peritectic system of Sn-10Sb, the liquidus line temperature is high, when not cooling it in a high-speed cooling region that exceeds the cooling speed of 20° C./sec, the course compound of SbSn will crystallize out and it is not favorable.

From the above, the condition of the addition concentration of Sb is set to not more than 9.5 mass %. Anyway, in a case where Sb is added in order to obtain the mechanical strength in the solder solidified state, it is favorable to set the addition concentration of Sb to not more than 9.5% that is the solid solution limit with no inclusion of 0, and in order to lower the surface tension in order to further lower the void generation rate and to promote improvement of the wettability, it is more favorable to set Sb in a range of at least 6.2 mass % and not more than 9.5 mass %.

Incidentally, since the SnSb based solder material is a peritectic system material, a definite eutectic component ratio is not determined, and the size of the solidified nucleus is changed depending on differences in impurity amount, cooling speed and so forth and it influences the wettability, as a result of examination of the range of the addition concentration of Sb, it is confirmed that it exhibits a favorable result when it is in each of the above-mentioned ranges.

Then, there can be provided the power semiconductor module 10 that is high in durability and reliability, by using the above-described lead-free solders as the lead-free solders 21 and 22 of the aforementioned power semiconductor module 10.

Incidentally, although in the above-mentioned embodiments, a case where the power semiconductor module has been applied as a soldered article has been described, it is not limited thereto and the present invention can be applied to a soldered article that an Ag-containing member that contains Ag is soldered to the joining object member not limited to the Ag electrode.

Summarizing the above-mentioned present invention, one aspect of the soldering method for the Ag containing lead-free solder relevant to the first invention includes, in the soldering method for the Ag containing lead free solder to be soldered to the Ag containing member, the first step of bringing the lead-free solder having the composition that contains Ag that the relation between the concentration C (mass %) of Ag contained in the Sn—Ag-based lead-free solder before soldering of the mass M (g) and the elution amount B (g) of Ag contained in the Ag-containing member becomes $$1.0 \text{ mass \%} \leq (M \times C + B) \times 100/(M+B) \leq 4.6 \text{ mass \%}$$

and that the balance consists of Sn and the unavoidable impurities into contact with the Ag-containing member, the second step of heating and melting the lead-free solder, and the third step of cooling the lead-free solder.

According to this configuration, by adjusting in advance the Ag content amount in the Ag-containing lead-free solder used in the first step so as to be set in the aforementioned desired range in the third step, by taking the Ag amount that shifts from the Ag-containing member to the Ag-containing lead-free solder in the second step into consideration, it can be controlled to the precipitation amount of the Ag compound of a range that the surface tension of the Ag-containing lead-free solder in the second step is lowered. Since the surface tension is low, the solder wettability becomes good. Then, discharge of bubbles when soldered becomes favorable and generation of the voids can be reduced.

In addition, in one aspect of the soldering method for the Ag-containing lead-free solder, the composition of the lead-free solder in the first step may be configured by a multiple eutectic system that a precipitation strengthening element that is not more than 0.1 mass % in solubility limit concentration has been added to a Sn—Ag eutectic system, and the lead-free solder in the third step may have a composition that a total mass of Ag shifted from the Ag-containing member to the lead-free solder, Ag contained in the lead-free solder and the precipitation strengthening element is at least 1.0 mass % and not more than 4.6 mass % relative to the mass of the lead-free solder in the third step and the balance consists of Sn and the unavoidable impurities.

According to this configuration, the precipitation strengthening element is contained in the lead-free solder and thereby the tensile strength of the solder can be improved.

As the above-mentioned precipitation strengthening element, at least one or more kinds of elements selected from the group consisting of, for example, Cu, Ni, Fe, Cr, Co, Zn, Pt, and Ti are used.

In addition, in one aspect described in any one of the above-mentioned soldering methods for the Ag-containing lead-free solder, the composition of the lead-free solder in the first step may be configured by a multiple eutectic system that Sb is contained in the Sn—Ag eutectic system, and a composition of the lead-free solder in the third step is consisting Sb of not more than 9.5 mass % not including of 0 and the balance consisting of Sn and the unavoidable impurities.

According to this configuration, the tensile strength of the solder can be improved by containing Sb in the Ag-containing lead-free solder. In a case where the precipitation strengthening element and Sb are contained in the Ag-containing lead-free solder, the tensile strength of the solder can be more improved.

In addition, in the soldering method for the above-mentioned Ag-containing lead-free solder, the Ag concentration may be 2.5 mass % to 3.9 mass %, and the Sb concentration may be at least 6.2 mass % and not more than 9.5 mass & relative to the mass of the lead-free solder that has been melted and brought into contact with the Ag-containing member.

According to this configuration, the tensile strength of the solder can be more improved by adding Sb to the Ag-containing lead-free solder, and the void generation rate can be made closer to 0%.

In addition, in one aspect described in any one of the soldering methods for the above-mentioned Ag-containing lead-free solder, the lead-free solder in the third step may be made such that a total mass of Ag shifted from the Ag-containing member to the lead-free solder and Ag contained in the lead-free solder is at least 2.5 mass % and not more than 3.9 mass % relative to the mass of the lead-free solder in the third step.

According to this configuration, prevention of void generation and improvement of the solder wettability can be promoted by appropriately controlling the concentration of Ag contained in the lead-free solder in the second step.

In addition, in one aspect described in any one of the soldering methods for the above-mentioned Ag-containing lead-free solder, a thickness of the Ag-containing member before soldering may be at least 0.2 μm and not more than 2 μm.

According to this configuration, the concentration of Ag melted into the lead-free solder can be controlled by controlling the thickness of the Ag-containing member, and prevention of void generation and improvement of the solder wettability can be promoted.

In addition, one aspect of a soldered article of the present invention is characterized by possessing a semiconductor chip, an Ag-containing electrode that has been arranged on a surface of the semiconductor chip as the Ag-containing member and an Ag-containing lead-free solder soldered byn the soldering method for the Ag-containing lead-free solder described in any one of the above.

According to this configuration, the solder wettability of the Ag-containing lead-free solder that is being soldered can be improved and generation of the voids in the Ag-containing lead-free solder after soldered can be prevented.

In addition, in the above-mentioned soldered article, it may possess an insulating circuit substrate equipped with a wiring circuit pattern, and the semiconductor chip may be made such that a control electrode and a high potential side electrode are arranged on one surface and a low potential side Ag-containing electrode to be soldered to the wiring circuit pattern of the insulating circuit substrate with the Ag-containing lead-free solder is arranged on the other surface.

According to this configuration, the semiconductor chip having the Ag-containing electrode can be joined to the wiring circuit pattern of the insulating circuit substrate in a state where void generation has been prevented and the solder wettability has been improved.

REFERENCE SIGNS LIST

10 . . . power semiconductor module
11 . . . insulating substrate
11$a$ . . . insulating layer
11$b$ . . . metal plate
11$c$-11$d$ . . . circuit pattern
12 . . . IGBT
12$c$ . . . collector electrode
12$e$ . . . emitter electrode
12$g$ . . . gate electrode
13 . . . FWD
13$k$ . . . cathode electrode
13$a$ . . . anode electrode
14 . . . insulating substrate
14$a$ . . . insulating layer
14$b$, 14$c$ . . . circuit pattern
15 . . . control IC
16$a$-16$c$ . . . external lead terminal
17, 18 . . . bonding wire
19 . . . resin case
20 . . . sealing resin
21, 22 . . . lead-free solder
31, 32 . . . intermetallic compound 41 ... solvent atom
42 ... solute atom

The invention claimed is:

1. A soldering method for Ag-containing lead-free solders to be soldered to an Ag-containing member comprising:
a first step of bringing a lead-free solder into contact with the Ag-containing member, the lead-free solder having a composition consisting of Ag and the balance of Sn and unavoidable impurities, the lead-free solder having a concentration C (mass %) of Ag contained in an Sn—Ag based lead-free solder before soldering of a mass M(g);
a second step of heating and melting the lead-free solder in contact with the Ag-containing member such that an elution amount B(g) of Ag contained in the Ag-containing member is eluted into the lead-free solder so that a concentration of Ag contained in the lead-free solder after the heating satisfies a relation between the concentration C, the mass M, and the elution amount B as follows:

1.0 mass %≤$(M \times C+B) \times 100/(M+B)$≤4.6 mass %; and a third step of cooling the lead-free solder.

2. The soldering method for Ag-containing lead-free solders according to claim 1, wherein
the composition of the lead-free solder in the first step is configured by a multiple eutectic system that a precipitation strengthening element that is not more than 0.1 mass % in solubility limit concentration has been added to a Sn—Ag eutectic system, and
the lead-free solder in the third step has a composition that a total mass of Ag shifted from the Ag-containing member to the lead-free solder, Ag contained in the lead-free solder and the precipitation strengthening element is at least 1.0 mass % and not more than 4.6 mass % relative to the mass of the lead-free solder in the third step and the balance consists of Sn and the unavoidable impurities.

3. The soldering method for Ag-containing lead-free solders according to claim 2, wherein
the precipitation strengthening element is at least one or more kinds of elements selected from a group consisting of Cu, Ni, Fe, Cr, Co, Zn, Pt and Ti.

4. The soldering method for Ag-containing lead-free solders according to claim 1, wherein
the composition of the lead-free solder in the first step is configured by a multiple eutectic system that Sb is contained in the Sn—Ag eutectic system, and
a composition of the lead-free solder in the third step is consisting Sb of not more than 9.5 mass % not including of 0 and the balance consisting of Sn and the unavoidable impurities.

5. The soldering method for Ag-containing lead-free solders according to claim 4, wherein
Ag concentration is 2.5 mass % to 3.9 mass %, and Sb concentration is at least 6.2 mass % and not more than 9.5 mass % relative to the mass of the lead-free solder after melted and brought into contact with the Ag-containing member.

6. The soldering method for Ag-containing lead-free solders according to claim 1, wherein
the lead-free solder in the third step is made such that a total mass of Ag shifted from the Ag-containing member to the lead-free solder and Ag contained in the lead-free solder is at least 2.5 mass % and not more than 3.9 mass % relative to the mass of the lead-free solder in the third step.

7. The soldering method for Ag-containing lead-fee solders according to claim 1, wherein
a thickness of the Ag-containing member before soldering is at least 0.2 μm and not more than 2 μm.

8. A soldered article comprising:
a semiconductor chip;
an Ag-containing electrode arranged on a surface of the semiconductor chip as the Ag-containing member; and
an Ag-containing lead-free solder soldered by the soldering method for Ag-containing lead-free solders according to claim 1.

9. The soldered article according to claim 8, comprising an insulating circuit substrate equipped with a wiring circuit pattern, wherein
the semiconductor chip is made such that a control electrode and a high potential side electrode are arranged on one surface and a low potential side Ag-containing electrode to be soldered to the wiring circuit pattern of the insulating circuit substrate with the Ag-containing lead-free solder is arranged on the other surface.

10. A soldering method for Ag-containing lead-free solders to be soldered to an Ag-containing member comprising:
bringing a lead-free solder into contact with the Ag-containing member, the lead-free solder having a composition consisting of Ag and the balance of Sn and unavoidable impurities, the lead-free solder having a concentration C (mass %) of Ag contained in an Sn—Ag based lead-free solder before soldering of a mass M(g);
heating and melting the lead-free solder in contact with the Ag-containing member such that an elution amount B(g) of Ag contained in the Ag-containing member is eluted into the lead-free solder so that a concentration of Ag contained in the lead-free solder after the heating satisfies a relation between the concentration C, the mass M, and the elution amount B as follows:

1.0 mass %≤$(M \times C+B) \times 100/(M+B)$≤4.6 mass %; and cooling the lead-free solder.

* * * * *

UNITED STATES PATENT AND TRADEMARK OFFICE
CERTIFICATE OF CORRECTION

PATENT NO. : 10,002,845 B2
APPLICATION NO. : 15/276156
DATED : June 19, 2018
INVENTOR(S) : Hirohiko Watanabe et al.

Page 1 of 1

It is certified that error appears in the above-identified patent and that said Letters Patent is hereby corrected as shown below:

On the Title Page

Item [*] (Notice), Line 18:
Delete "0 days. days." and insert -- 0 days. --, therefore.

In the Specification

Column 1, Line 8:
Delete "§ 111(a)," and insert -- §111(a), --, therefore.

In the Claims

Column 16, Line 14:
In Claim 7, delete "lead-fee" and insert -- lead-free --, therefore.

Signed and Sealed this
Fourth Day of September, 2018

Andrei Iancu
*Director of the United States Patent and Trademark Office*